United States Patent [19]

Hartman et al.

[11] Patent Number: 4,586,073
[45] Date of Patent: Apr. 29, 1986

[54] HIGH VOLTAGE JUNCTION SOLID-STATE SWITCH

[75] Inventors: Adrian R. Hartman, New Providence; Bernard T. Murphy, Summit, both of N.J.; Terence J. Riley, Wyomissing, Pa.; Peter W. Shackle, West Melborne, Fla.

[73] Assignee: AT&T Bell Laboratories, Murray Hill, N.J.

[21] Appl. No.: 248,205

[22] Filed: Mar. 27, 1981

Related U.S. Application Data

[63] Continuation-in-part of Ser. No. 107,773, Dec. 28, 1979, which is a continuation-in-part of Ser. No. 971,886, Dec. 20, 1978, abandoned.

[51] Int. Cl.[4] ............................................. H01L 29/78
[52] U.S. Cl. ........................................ 357/45; 357/44; 357/46; 357/48; 357/37; 357/38; 357/39; 357/21; 357/22
[58] Field of Search ..................... 357/21, 22, 37, 38, 357/39, 44, 46, 45, 48

[56] References Cited

U.S. PATENT DOCUMENTS 3,755,012  8/1973  George et al. ........................ 357/22
4,060,821 11/1977  Houston et al. ...................... 357/22

FOREIGN PATENT DOCUMENTS 2102103  7/1971  Fed. Rep. of Germany ........ 357/22

OTHER PUBLICATIONS

A MOS-Controlled Triac Device-Scharf et al.-pp. 222-223, 1978 IEEE International Solid-State Circuits Conference.

Primary Examiner—Edward J. Wojciechowicz
Attorney, Agent, or Firm—David I. Caplan

[57] ABSTRACT

A high voltage solid-state switch, which provides bidirectional blocking, consists of a first p− type semiconductor body on an n type semiconductor substrate. A p+ type anode region and an n+ type cathode region exist in portions of the semiconductor body. A second p type region of higher impurity concentration than the semiconductor body surrounds the cathode region. The anode region and second p type region are separated from each other by a portion of the semiconductor body. The semiconductor substrate, which acts as a gate, has an electrode connected thereto. Separate electrodes are connected to the anode and cathode regions.

24 Claims, 8 Drawing Figures

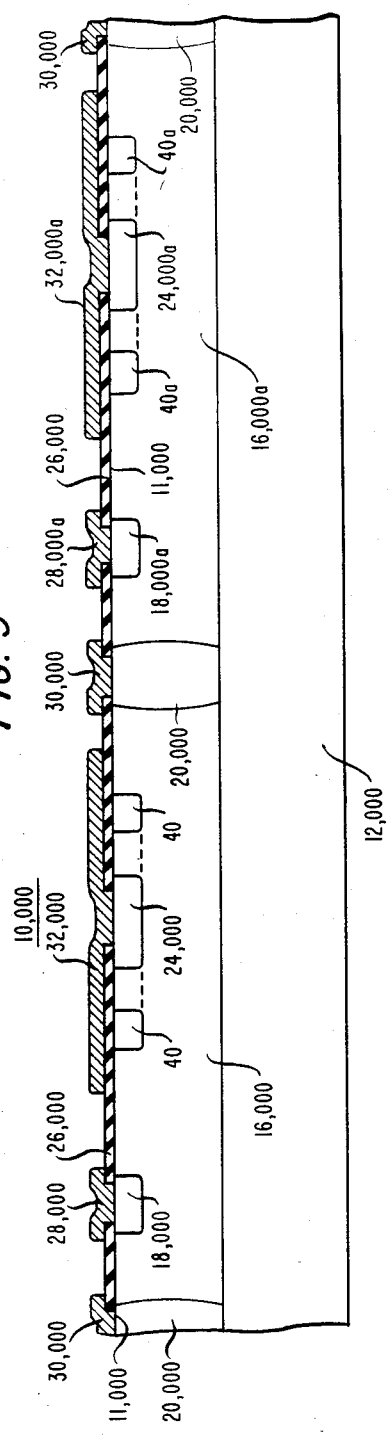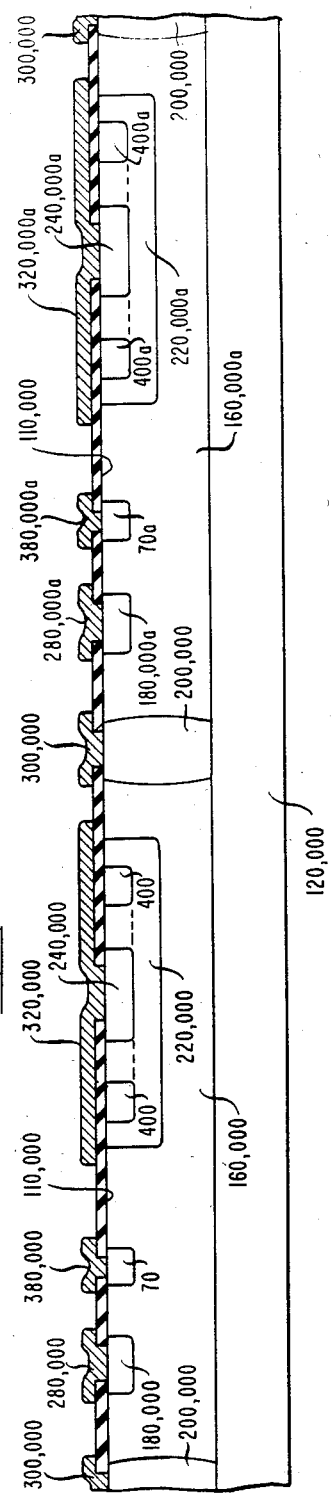

HIGH VOLTAGE JUNCTION SOLID-STATE SWITCH

CROSS-REFERENCE TO RELATED APPLICATIONS

This application is a continuation-in-part of our copending application Ser. No. 107,773, filed Dec. 28, 1979, which is a continuation-in-part of our application Ser. No. 971,886, filed Dec. 20, 1978 now abandoned.

TECHNICAL FIELD

This invention relates to solid-state structures and, in particular, to high voltage solid-state structures useful in telephone switching systems and many other applications.

BACKGROUND OF THE INVENTION

German Patent No. 2,102,103 discloses a fieldeffect diode structure having a p− type substrate with an n− type epitaxial layer grown on top of the substrate. The substrate can be replaced by an insulating material. A first p+ type anode region, a second p+ type gate region, and an n+ type cathode region exist within portions of the epitaxial layer and each forms a portion of a common surface of the epitaxial layer. The three regions are separated from each other by portions of the epitaxial layer. The patent states that conduction between anode and cathode can only be interrupted by setting the anode voltage to a zero or negative level for a short period of time and by setting the gate voltage to a predetermined critical level. It is undesirable and/or impractical in many applications to have to adjust the anode voltage. Leakage in the diode is stated to cause it to switch on when it should be off. It is unclear how the suggested solution of a register helps solve this problem and whether or not such a register is a discrete component or can be integrated on the same substrate as the diode. It is also unclear how to physically and electrically isolate the diode from other components on the common substrate.

In an article entitled "A Field Terminated Diode" by Douglas E. Houston et al, published in *IEEE Transactions on Electron Devices,* Vol. ED-23, No. 8, August 1976, and in U.S. Pat. No. 4,060,821 (Douglas E. Houston et al), issued Nov. 29, 1977, there is described a discrete solid-state high voltage switch that has a vertical geometry and which includes a region which can be inched off to provide an "OFF" state or which can be made highly conductive with dual carrier injection to provide an "ON" state. One problem with this switch is that it is not easily manufacturable with other like switching devices on a common substrate. Another problem is that the spacing between the grids and the cathode should be small to limit the magnitude of the control grid voltage; however, this limits the useful voltage range because it decreases grid-to-cathode breakdown voltage. This limitation effectively limits the use of two of the devices with the cathode of each coupled to the anode of the other to relatively low voltages. Such a dual device structure would be useful as a high voltage bidirectional solid-state switch. An additional problem is that the base region should ideally be highly doped to avoid punch-through from the anode to the grid; however, this leads to a low voltage breakdown between anode and cathode. Widening of the base region limits the punch-through effect; however, it also increases the resistance of the device in the "ON" state.

It is desirable to have a solid-state switch which is easily integratable such that two or more switches can be simultaneously fabricated on a common substrate and wherein each switch is adapted such that one terminal thereof controls its state and each switch is capable of bilateral blocking of relatively high voltages and breaking current. Structures of this type are described in U.S. patent applications Ser. Nos. 972,056 and 107,774 filed Dec. 20, 1978 and Dec. 29, 1979, respectively, and in U.S. patent application Ser. No. 248,192 which is being filed concurrently with this application. This present application, which has a common assignee with the above denoted applications, relates to subsequent improvement in such structures.

SUMMARY OF THE INVENTION

One embodiment of the present invention comprises a structure comprising a semiconductor body whose bulk is of one conductivity type and which has a major surface and in which the semiconductor body is formed on a semiconductor support member (a third region) which is of the opposite conductivity type. The support is typically a semiconductor substrate. Separated localized first and second regions exist in the semiconductor body. The first region is of the one conductivity type and the second region is of the opposite conductivity type. Each region has a portion thereof which extends to the major surface. Both regions are of relatively low resistivity as compared to the bulk of the semiconductor body. The first and second regions serve as the anode and cathode of the structure. Separate low resistance electrical contacts are made to the anode and cathode regions and to the substrate which serves as a gate of the structure. In a preferred embodiment the substrate and other regions of like conductivity type wrap around the semiconductor body. The structure is adapted to selectively facilitate substantial current flow between the first and second regions or to divert a sufficient flow of said current into the substrate (third region) so as to interrupt (cut off) said current flow between the first and second regions. It is further adapted to selectively inhibit current flowing between the first and second regions. The structure is still further adapted such that selectively during operation there is a dual carrier injection. The overall geometry and impurity concentrations of the structure have been selected so as to aid in the inhibiting or interrupting of current flow between the first and third regions.

This structure, when suitably designed, can be operated as a switch which is characterized by a low impedance path between anode and cathode when in the ON (conducting) state and a high impedance path between anode and cathode when in the OFF (blocking) state. The potential applied to the substrate (gate) determines the state of the switch. There is no need to adjust the potentials of the anode or the cathode to cause the switch to assume the OFF state. The switch inhibits or interrupts (cuts off) conduction between the anode and cathode when it is set to the OFF state. During the ON state, with appropriate potentials applied to the anode and cathode, there is dual carrier injection that results in the resistance between anode and cathode being relatively low.

Another embodiment of the invention comprises a structure which comprises a semiconductor body of the one type conductivity with a wrap around semiconductor region of the opposite type conductivity which is in turn wrapped around by another semiconductor region which is of the one conductivity type and is typically a semiconductor substrate. The semiconductor body contains the same two regions as the earlier discussed semiconductor body. A plurality of the semiconductor bodies, each having a surrounding separate semiconductor region, are formed in the common semiconductor substrate.

These structures, which are to be denoted as gated diode switches (GDSs), when suitably designed, are capable of blocking relatively large potential differences between anode and cathode in the OFF state, independent of polarity, and are capable of conducting relatively large amounts of current with a relatively low voltage drop between anode and cathode in the ON state.

The bilateral blocking characteristic of these GDS structures makes them particularly useful in many applications. Two of the above-described GDSs can be coupled together with the gates being common and the cathode of each coupled to the anode of the other. This combination forms a bidirectional high voltage switch.

Arrays of the GDSs can be fabricated on a single integrated circuit chip together with other circuit components, or two GDSs can be fabricated on a single integrated circuit chip with a common gate structure so as to form a bidirectional switch. Two GDSs of the array of GDSs can be electrically connected to also form a bidirectional switch.

These and other novel features and advantages of the present invention are better understood from consideration of the following detailed description taken in conjunction with the accompanying drawing.

BRIEF DESCRIPTION OF THE DRAWINGS

FIG. 4 illustrates a structure in accordance with still another embodiment of the invention;

FIG. 5 illustrates a structure in accordance with still another embodiment of the invention;

FIG. 6 illustrates a structure in accordance with still another embodiment of the invention;

DETAILED DESCRIPTION

Figure 1:
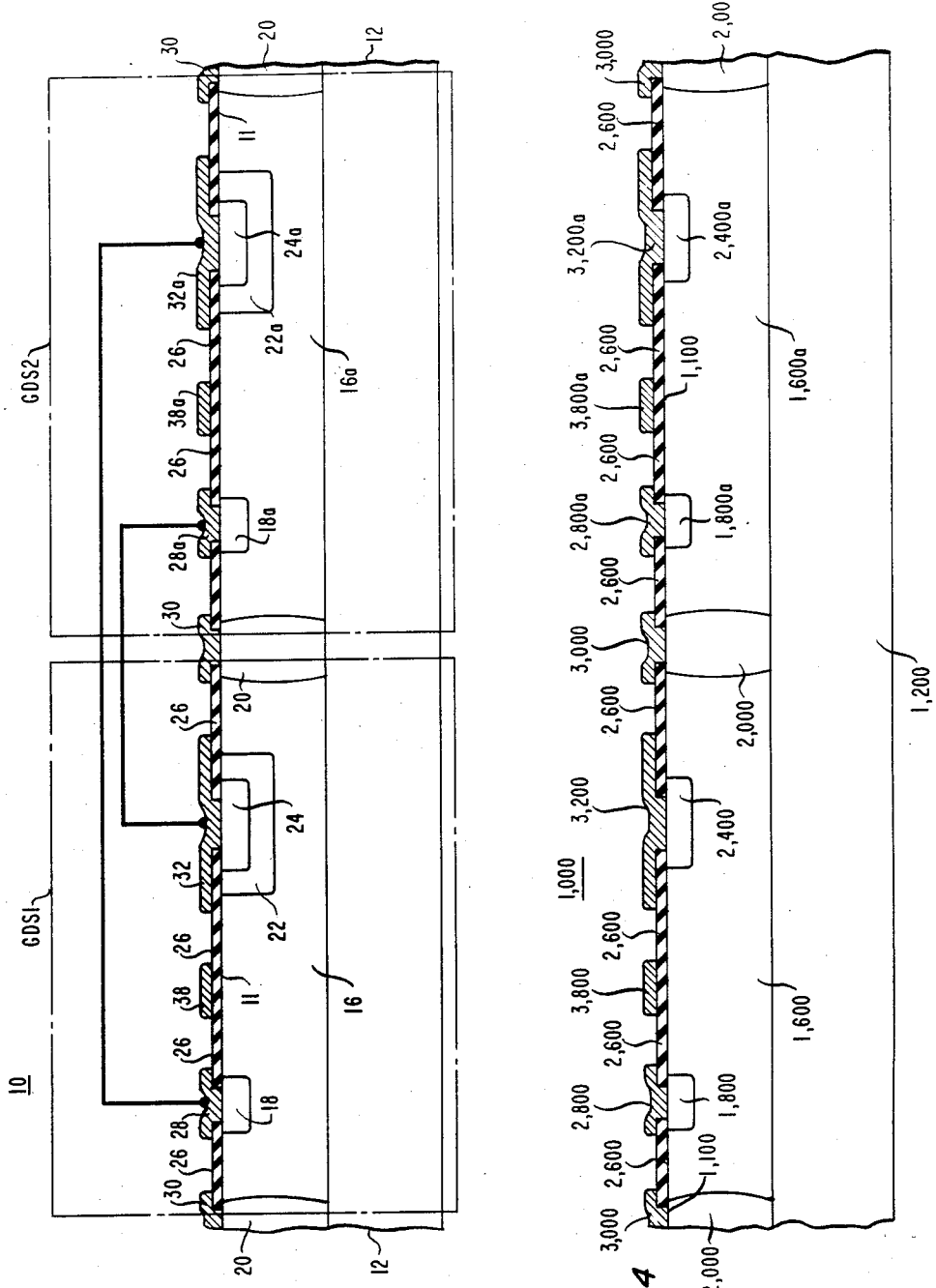
FIG. 1 illustrates a structure in accordance with one embodiment of the invention.

Referring now to FIG. 1, there is illustrated a semiconductor structure 10 comprising two essentially identical gated diode switches GDS1 and GDS2 which are illustrated within dashed line rectangles and are both formed in a support member 12. Semiconductor structure 10 has a major surface 11. An epitaxial layer of the one type conductivity contacts a support member 12. Support member 12 is typically a semiconductor substrate which acts as common gate and support for GDS1 and GDS2. The epitaxial layer is isolated by semiconductor regions 20 and substrate 12 into semiconductor bodies 16 and 16a. Region 20 and substrate 12, which are both of the opposite conductivity type of body 16 and 16a, in effect wrap around semiconductor bodies 16 and 16a. A plurality of bodies 16, 16a can be formed on substrate 12 instead of just the two illustrated.

Regions 20 are of the same conductivity type as substrate 12 and extend from major surface 11 down to substrate 12. Regions 20 are of sufficiently high impurity concentration to permit low resistance contact by metal electrodes. Within body 16 is also included a semiconductor anode region 18 of the same conductivity type as body 16 but of higher impurity concentration and a semiconductor region 22 of the same conductivity type as body 16 but of impurity concentrations which is intermediate between anode region 18 and body 16. A semiconductor cathode region 24 is included in a portion of region 22 and has a portion which extends to major surface 11. Region 24 is of the same conductivity type and of essentially the same impurity concentration as regions 20. Electrodes 28, 32, and 30 make low resistance contact to regions 18, 24, and 20, respectively. Region 20 makes low resistance contact to substrate 12. Thus, electrode 30 makes low resistance contact to substrate 12 and serves as a common gate electrode for GDS1 and GDS2. Accordingly, substrate 12 serves as a common gate region for GDS1 and GDS2. A region (conductor) 38, which is optional and can be a metal or semiconductor material, is located between anode electrode 28 and cathode electrode 32. Region 38 is typically electrically coupled to substrate 12 by an electrical connection to electrode 30 and is separated from surface 11 by dielectric layer 26.

Body 16a has contained therein semiconductor regions 18a, 24a, and 22a. Electrodes 28a, 32a, and 30 are coupled to regions 18a, 24a, and 20a, respectively. These regions are essentially the same as the corresponding regions of body 16.

An insulator layer 26 electrically isolates all of the above-described electrodes from portions of structure 10, except those portions which are meant to be electrically contacted.

In one illustrative embodiment, substrate 12 is of n type conductivity, regions 20 and 24(24a) are of n+ type conductivity, body 16(16a) is of p− type conductivity, region 18(18a) of p+ type conductivity, region 22(22a) is of p type conductivity which is lower than that of body 16(16a), and electrodes 28(28a), 32(32a), and 30 and region 38 are aluminum. In this embodiment anode electrode 28 is electrically coupled to cathode electrode 32a, and cathode electrode 32 is coupled to anode electrode 28a.

Figure 2:
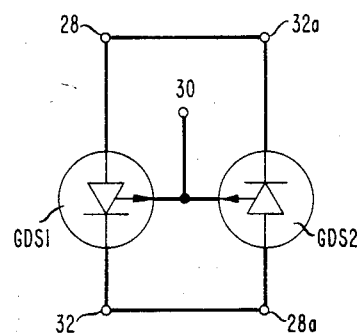
FIG. 2 illustrates a proposed electrical symbol for the structure of FIG. 1.

FIG. 2 illustrates adopted electrical symbols for GDS1 and GDS2. The anode, cathode, and gate electrode terminals of GDS1 are 28, 32, and 30, respectively. The corresponding terminals of GDS2 are 28a, 32a, and 30. This combination of GDS1 and GDS2 acts as a bidirectional switch which is capable of bilateral blocking of potentials independent of whether the anode or cathode of either gated diode switch is at the more positive potential.

GDS1 and GDS2 are both essentially identical and operate in essentially the same manner. Accordingly, the description below of GDS1 is equally applicable to GDS2. GDS1 is characterized by a relatively low resistance path between anode region 18 and cathode region 24 when in the ON (conducting) state and by a substantially higher impedance when in the OFF (blocking) state. With operating potentials applied to the regions 18 and 24, the potential applied to substrate 12 (the gate region) determines the state of the switch. Regions 18 and 24 serve as the anode and cathode regions, respectively, when semiconductor body 16 is of p— type conductivity. Regions 18 and 24 serve as the cathode and anode regions, respectively, when semiconductor body 16 is of n— type conductivity.

With body 16 being of p— type conductivity, conduction between anode region 18 and cathode region 24 is inhibited or interrupted (cut off) if the potential of substsrate 12 is sufficiently more positive than that of anode region 18, cathode region 24, and region 22. The amount of excess positive potential needed to inhibit or interrupt (cut off) conduction is a function of the geometry and impurity concentration (doping) levels of structure 10. This positive gate potential causes a vertical cross-sectional portion of body 16 between substrate 12 and the portion of dielectric layer 26 thereabove to be depleted and the potential of this portion of body 16 to be greater in magnitude than that of anode region 18, cathode region 24, and region 22. This essentially pinches off body 16 against dielectric layer 26 in the bulk portion thereof above substrate 12 and extending up to dielectric layer 26. The positive potential of the aforesaid portion of body 16 is a potential barrier which inhibits conduction of holes from anode region 18 to cathode region 24. If conduction exists between anode region 18 and cathode region 24 before the potential of the substrate 12 is raised to the high potential level, then substrate 12 serves to collect electrons emitted at cathode region 24 before they can reach anode region 18. This serves to help interrupt conduction between anode region 18 and cathode region 24. In addition, the high level potential of substrate 12 serves to cause a vertical cross-sectional portion of body 16 between substrate 12 and the portion of dielectric layer 26 thereabove to be depleted and the potential of this portion of body 16 to be greater in magnitude than that of anode region 18, cathode region 24, and region 22. The blocking (essentially nonconducting) state, is the OFF state. The geometry and impurity concentrations of structure 10 are designed to help inhibit or interrupt current flow between anode region 18 and cathode region 24. Control circuitry capable of supplying the needed gate potentials and absorbing the electrons is illustrated and described in U.S. patent application Ser. No. 248,206 which is being filed concurrently with this application and which has a common assignee.

With semiconductor body 16 being of p— type conductivity, conduction from anode region 18 to cathode region 24 occurs if region 18 is forward-biased with respect to region 24 and the potential of gate region 20 is below a level which inhibits or interrupts conduction between anode region 18 and cathode region 24. During the ON state holes are injected into body 16 from anode region 18 and electrons are injected into body 16 from cathode region 24. These holes and electrons can be in sufficient numbers to form a plasma which conductivity modulates body 16. This effectively lowers the resistance of body 16 such that the resistance between anode region 18 and cathode region 24 is relatively low when structure 10 is operating in the ON state. This type of operation is denoted as dual carrier injection.

Region 22 helps limit the punch-through of a depletion layer formed during operation between substrate 12 and region 20, which both act as the gate of the structure, and cathode region 24 and helps inhibit formation of a surface inversion layer between these regions. It serves to increase maximum operating voltage and to reduce leakage currents.

The spacing between anode region 18 and cathode region 24 can be less than the corresponding spacing of the anode and cathode of FIG. 1 of U.S. patent application Ser. No. 248,192 because there is no gate region directly in between the anode and cathode regions of the present invention.

During the ON state of structure 10, the junction diode comprising semiconductor body 16 and substrate 12 can become forward-biased. Current limiting means (not illustrated) are normally included to limit the conduction through the forward-biased diode. One example of such current limiting means is illustrated and described in U.S. patent application Ser. No. 248,206.

The ON state can be achieved by having the potential of the anode region 18 greater than that of the cathode region 24 and forward-biasing the anode region 18 with respect to the substrate 12. Typically, 1-10 microamperes are pulled out of substrate 12 while the anode-gate junction is forward-biased to cause structure 10 to assume the ON state.

It is possible to operate structure 10 in the ON state with the potential of substrate 12 at the same or a more positive level than that of anode region 18, cathode region 24, and region 22, so long as the potential of gate region 20 is below a level which essentially completely depletes a vertical cross-sectional portion of semiconductor body 16 between anode region 18 and cathode region 24. With substrate 12 held at such a potential level, the junction diode comprising semiconductor body 16 and gate region 20 has a zero forward bias or is reverse-biased.

The use of region 38 reduces the magnitude of the potential needed to inhibit or cut off conduction. In the OFF state GDS1 is capable of bilateral blocking of relatively large potentials between anode and cathode regions, independent of which region is at the more positive potential.

GDS1 and GDS2 need not have the anodes and cathodes connected together. GDS1 and GDS2 can be used individually but the gates are common.

GDS1 can be used as a type of bipolar transistor with substrate 12 and regions 20 serving as the collector, region 24 serving as the emitter, and regions 18 and 22 and semiconductor body 16 serving as the base. As long as the potential applied to the collector (substrate 12 and regions 20) is below the level which inhibits or interrupts current flow between regions 18 and 24 and the base (body 16 and region 22) is forward-biased with respect to the emitter (region 24), conduction between the collector (substrate 12 and regions 20) and the emitter (region 24) occurs. Base current which supports this conduction originates from base contact region 18. If the collector voltage is increased to a level which is sufficient to cut off conduction between regions 18 and 24, then the base current from region 18 is cut off and, consequently, conduction between the collector (substrate 12 and regions 20) and the emitter (region 24) is also cut off.

Figure 3:
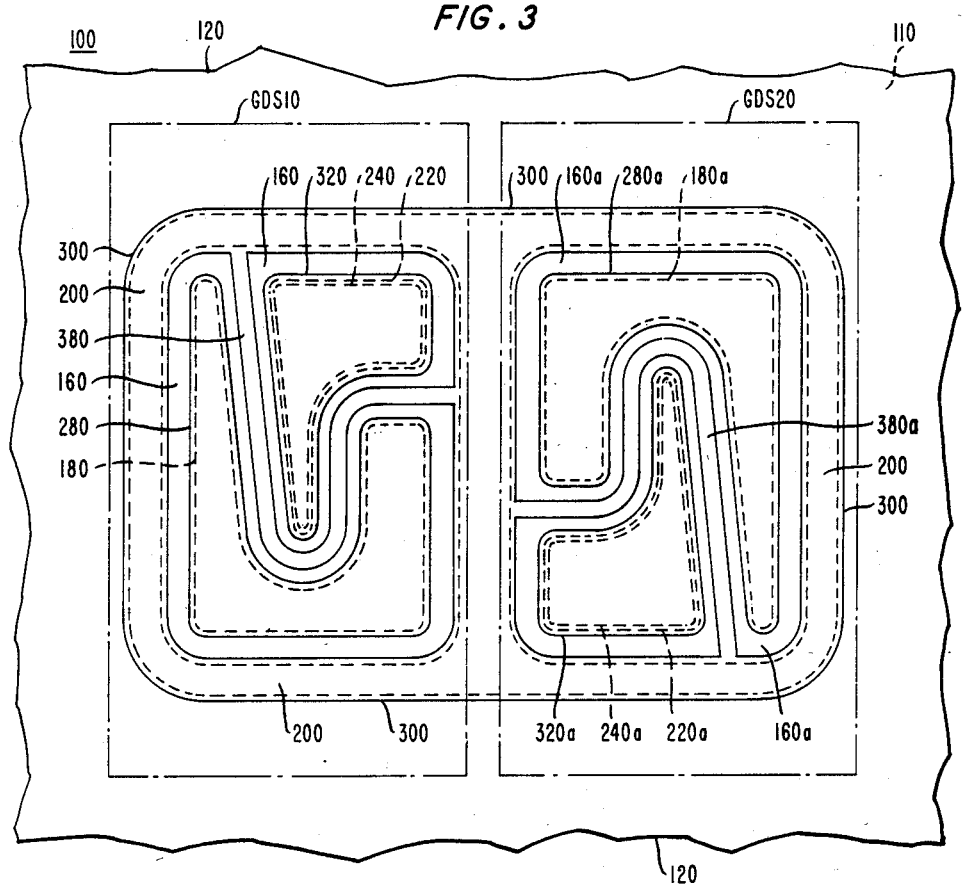
FIG. 3 illustrates a top view of a structure in accordance with another embodiment of the invention.

Referring now to FIG. 3, there is illustrated a top view of a preferred embodiment of a dual GDS semiconductor structure 100 which has been fabricated. Structure 100 is similar to structure 10 except the anode and cathode regions are curved. This geometry tends to limit localized voltage field concentration which causes voltage breakdown and adds additional perimeter common to the anode and cathode regions in order to facilitate low ON resistance and thereby facilitate high current operation. Structure 100 has been fabricated on an n type substrate having a thickness of 18 to 22 mils and a conductivity of $10^{15}$ to $10^{16}$ impurities/cm$^3$. Bodies 160 and 160a are of p− type conductivity with a thickness of 30 to 40 microns, a width of 720 microns, a length of 910 microns, and an impurity concentration in the range of $5-9\times10^{13}$ impurities/cm$^3$. Curved anode regions 180 and 180a are of p+ type conductivity with a thickness of 2 to 4 microns, and an impurity concentration of $10^{19}$ impurities/cm$^3$. Curved cathode regions 240 and 240a are of n+ type conductivity with a thickness of 2 to 4 microns, and an impurity concentration of $10^{19}$ impurities/cm$^3$. The overall length and width of the fabricated circuit is 1910 microns by 1300 microns. The spacing between anode and cathode is typically 120 microns. The dielectric layer 260 is typically 3–5 microns thick.

Some of the fabricated structures contained conductor regions 380, 380a which were 60 microns wide and others did not. The structures fabricated without regions 380, 380a required a potential of 22 more volts on the gate than the anode to inhibit or cut off conduction between anode and cathode. The structures fabricated with conductor regions 380, 380a required the gate potential to have an excess of only 7.5 volts over the anode potential to effect turnoff. The fabricated structure was able to block 300 volts and conduct 500 milliamperes with a voltage drop between anode and cathode of 2.2 volts. This structure was able to operate under current surges of 10 amperes for a duration of one millisecond.

Referring now to FIG. 4, there is illustrated a structure 1000. Structure 1000 is very similar to structure 10 and all components thereof which are essentially identical or similar to those of structure 10 are denoted by the same reference number with the addition of two "0s" at the end. The basic difference between structures 1000 and 10 is the elimination from structure 1000 of a semiconductor region like regions 22, 22a of structure 10 of FIG. 1. Appropriate spacing of regions 2400, 2400a from region 2000 provides sufficient protection against depletion layer punch-through to regions 2400, 2400a and allows operation of structure 1000 as a high voltage switch. In a preferred embodiment regions 3800 and 3800a are used.

Referring now to FIG. 5, there is illustrated a structure 10,000. Structure 10,000 is very similar to solid-state structure 10 and all components thereof which are essentially identical to those of structure 10 are denoted by the same reference number with the addition of three "0s" at the end. The basic difference between structures 10,000 and 10 is the use of semiconductor guard ring regions 40, 40a encircling regions 24,000, 24,000a and being separated therefrom by portions of bodies 16,000, 16,000a. Guard ring regions 40, 40a provide the same type of protection against surface layer inversion as regions 22, 22a of structure 10. The protection is believed adequate in some cases to provide a high voltage solid-state switch. Guard rings 40, 40a are of the same conductivity type as bodies 16,000, 16,000a but of lower resistivity. Guard rings 40, 40a can be extended (as is illustrated by the dashed lines) so as to contact cathode regions 24,000, 24,000a. Metallic electrodes (not illustrated), like 38 and 38a of FIG. 1, could be used between the respective anode and cathode electrodes.

Referring now to FIG. 6, there is illustrated a structure 100,000 which is similar to structure 10. All portions of structure 100,000 which are similar or essentially identical to corresponding portions of structure 10 are denoted by the same reference number with the addition of four "0s" at the end. One difference between structure 100,000 and structure 10 is the use of semiconductor guard ring regions 400, 400a encircling cathode regions 240,000, 240,000a. Guard rings 400, 400a are similar to semiconductor guard ring regions 40, 40a of structure 10,000. The dashed line portion of guard rings 400, 400a illustrates that they can be extended so as to contact cathodes 240,000, 240,000a. The combination of regions 220,000, 220,000a and guard rings 400, 400a provides protection against inversion of bodies 160,000, 160,000a, particularly between gate region 200,000 and cathode region 240,000, 240,000a, and provides protection against depletion layer punch-through to cathode region 240,000, 240,000a. This type of dual protection around cathode region 240,000, 240,000a is the preferred protection structure. Regions 220,000, 220,000a and 400, 400a are all of the same conductivity type as bodies 160,000, 160,000a but of lower resistivity. Regions 400, 400a have lower resistivity than regions 220,000, 220,000a. Another difference between structure 100,000 and structure 10 is semiconductor gate regions 70, 70a, which are of the same conductivity type as cathode regions 240,000, 240,000a. Gate regions 70, 70a are in electrical contact with electrodes 380,000, 380,000a and act as top gates. The use of gate regions 70, 70a results in a reduction in the magnitude of the potential necessary to cut off or inhibit conduction between anode regions 180,000, 180,000a and cathode regions 240,000, 240,000a.

Figure 7:
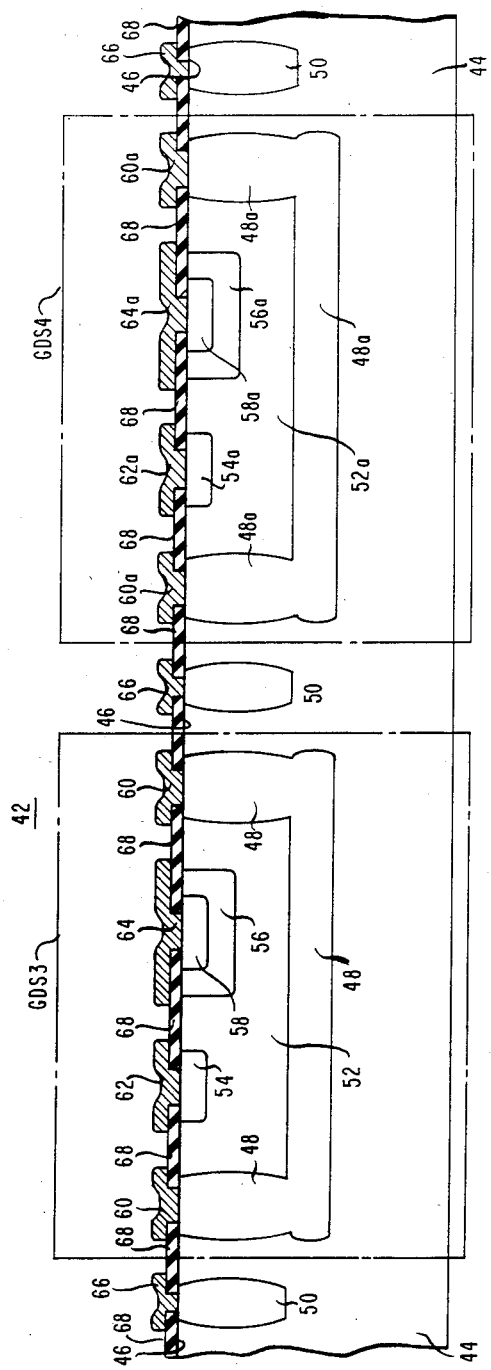
FIG. 7 illustrates a structure in accordance with still another embodiment of the invention.

Now referring to FIG. 7, there is illustrated a semiconductor structure 42 which comprises a plurality of essentially identical gated diode switches (GDSs) of which only two, GDS3 and GDS4 (illustrated within dashed line rectangles), are shown. Semiconductor structure 42 comprises a semiconductor support member 44 which is of a first conductivity type and has a major surface 46. Member 44 is typically a semiconductor substrate. Within a portion of substrate 44 are located separate regions 48 and 48a which are of the opposite conductivity type of substrate 44 and are separated from each other by portions of substrate 44 and by regions 50 which are of the same conductivity type as substrate 44 but of higher impurity concentration. Regions 50 are optional. Typically, regions 48 and 48a wrap around (surround) essentially identical semiconductor bodies 52 and 52a which are of the same conductivity type as substrate 44.

Within body 52 exists an anode region 54 which is of the same conductivity type as body 52 but of higher impurity concentration. Also within body 52 exists a region 56 which is of the same conductivity type as body 52 but of intermediate impurity concentration between that of anode region 54 and semiconductor body 52 and which is separated from region 54 by portions of body 52. A cathode region 58 exists within a portion of region 56 and is separated from body 52 by portions of region 56. Cathode region 58 is of the same conductivity type as region 48. Electrodes 60, 62, 64, and 66 make low resistance contact to regions 48, 54, 58, and 50, respectively. If regions 50 are eliminated, electrode 66 makes contact to region 44 directly or through a low resistivity semiconductor region (not illustrated) like region 54, but contained in a portion of substrate 44. An insulating layer 68, typically silicon dioxide, electrically isolates all of the electrodes of structure 42 from major surface 46 except in the regions in which it is desired to make low resistance contact.

Body 52a, regions 54a, 56a, and 58a and electrodes 60a, 62a, and 64a of GDS4 are essentially identical to the corresponding regions of GDS3.

Substrate 44 is typically held at the most negative potential available. This serves to reverse-bias the p—n junctions formed by regions 48, 48a and substrate 44 such that all the GDSs contained within substrate 44 are junction isolated from each other.

GDS3 and GDS4 operate in essentially the same manner as described for the operation of GDS1 and GDS2 of FIG. 1. Region 48 serves as the gate, with regions 54 and 58 serving as anode and cathode, respectively. It is to be noted that gate regions 48 and 48a are physically and electrically separate and, accordingly, GDS3 and GDS4 can be operated essentially completely independently of each other since the respective gates, anodes, and cathodes are electrically separate. Thus, structure 42 facilitates the fabrication of an array of GDSs with each GDS being capable of being operated independently of all other GDSs of the array.

It has been discovered that decreasing the impurity concentration of the bulk portion of semiconductor body 16 of structure 10 of FIG. 1 causes a modification in the mode of operation. Starting with the above design parameters, but with the impurity concentration of the bulk of semiconductor body 16 at approximately $1 \times 10^{13}$ instead of $9 \times 10^{13}$ impurities/cm$^3$, it was found that with the potential of substrate 12 (the gate) at approximately the same level as anode region 18, conduction between anode region 18 and cathode region 24 is inhibited or interrupted (cut off) except for a relatively low level flow. This is the OFF (high impedance) state. With a positive bias applied to anode region 18 relative to cathode region 24, and with substrate 12 allowed to essentially electrically float in potential, substantial current flow can exist between anode region 18 and cathode region 24. This is the ON (low impedance) state. The relatively low level current flow of the OFF state helps aids in switching structure 10 to the ON state. Control circuitry useful to control the state of a structure 10 which has the operating characteristics described in this paragraph is described in U.S. patent application Ser. No. 248,206 which is being filed concurrently with the present application and which is a continuation-in-part of U.S. patent application Ser. No. 107,771, filed Dec. 28, 1979. Ser. No. 107,771 is in itself a continuation-in-part of U.S. patent application Ser. No. 972,023 abandoned June 24, 1980.

One major advantage of structure 10, which has a semiconductor body 16 whose impurity concentration is as described immediately hereinabove, is that the gate (substrate) potential need only be at that of the anode potential to switch the structure to the OFF state. It is thus not necessary to use a higher potential than exists at the anode in order to operate structure 10. Many applications require high voltage and high current switches but the most positive potential available is that applied to one of the terminals of the switch. This embodiment of structure 10 can be used in such applications so long as a limited amount of current flow can be tolerated between the anode and cathode regions when structure 10 is in the OFF state. It is, however, necessary to maintain fairly tight tolerances on the impurity concentration of semiconductor body 16 in order to operate structure 10 as indicated.

Figure 8:
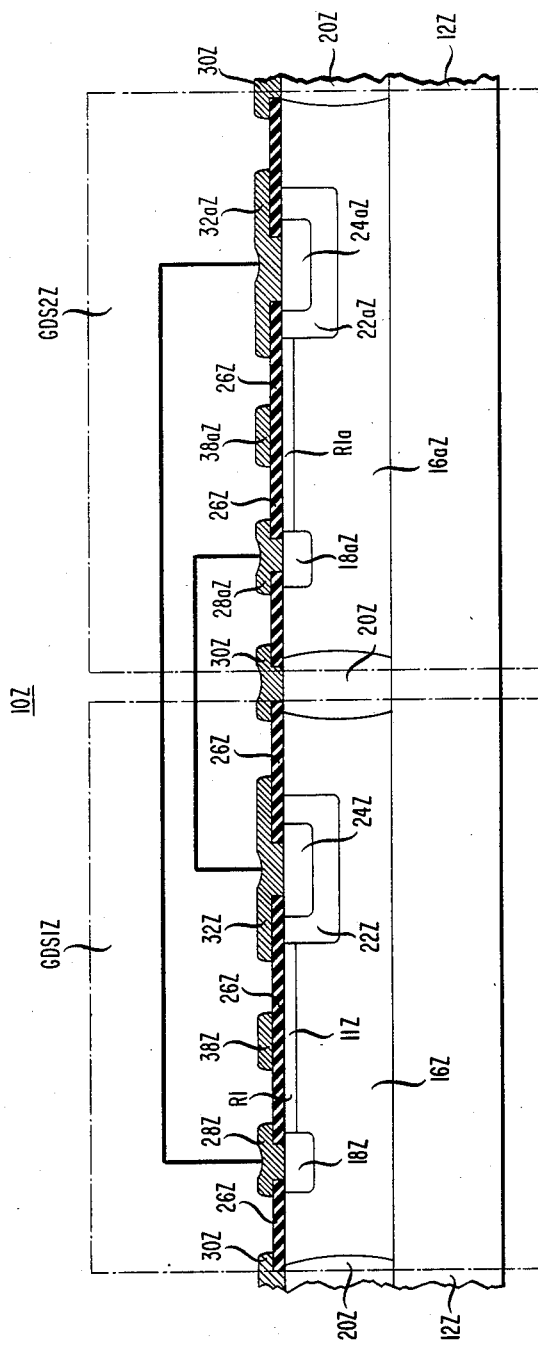
FIG. 8 illustrates a structure in accordance with still another embodiment of the invention.

Referring now to FIG. 8, there is illustrated a structure 10z which is very similar to structure 10 of FIG. 1 and all components thereof which are essentially identical or similar to structure 10 are denoted with the same reference number with the addition of a "z". The basic difference between structures 10z and 10 is the existence of resistive-type regions R1 and R1a in structure 10z which couple anode region 18z to shield region 22z and anode region 18az to shield region 22az. The inclusion of regions R1 and R1a allows structure 10z to be operated with the maximum needed gate potential being approximately equal to the anode potential and allows for a considerably wider variation in the impurity concentrations of semiconductor regions 16z and 16az than is possible if R1 and R1a are not utilized. R1 serves to provide a predictable high impedance path between anode region 18z and shield region 24z. R1a serves to provide a predictable high impedance path between anode region 18az and shield region 24az. Variations in the impurity concentration of semiconductor bodies 16z and 16az thus become less critical since a high impedance path is established between anode region 18z and shield region 24z and between anode region 18az and shield region 24az, and these paths exist relatively independent of the impurity concentration of semiconductor bodies 16z and 16az. Typically, the impurity concentration of semiconductor bodies 16z and 16az is between $2 \times 10^{12}$ impurities/cm$^3$ and $2 \times 10^{13}$ impurities/cm$^3$. R1 and R1a can be ion implanted or diffused into semiconductor body 16z and 16az, respectively. A first discrete resistor could be connected between anode electrode 28z and region 22z, if an electrode (not illustrated) is provided which makes low resistance contact with region 22z. A second discrete resistor R1a could be connected between anode electrode 28az and region 22az, if an electrode (not illustrated) makes low resistance contact with region 22az. These resistors would serve essentially the same purpose as R1 and R1a. In a preferred embodiment, R1 and R1a are ion implanted pinch type resistors and are of the same conductivity type as regions 18z, 18az, 22z and 22az. Regions 22z and 22az can be eliminated in some applications. In this case R1 and R1a are extended so as to connect directly to the associated cathode. A discrete R1 could be instead connected to anode electrode 28z and to a p+ type contact region (not illustrated) within body 16z and located close to cathode region 24z. A discrete R1az could be instead connected to anode electrode 28az and to a p+ type contact region (not illustrated) within body 16az and located close to cathode region 24az.

The embodiments described herein are intended to be illustrative of the general principles of the invention. For example, the impurity concentration levels, spacings between regions, and other dimensions of the regions can be adjusted to allow significantly higher operating voltages and currents than have been disclosed. In structure 42 of FIG. 7, a dielectric layer can be inserted between regions 48 and 48a and region 44 or such a dielectric layer can be substituted for regions 44 and 50. Additionally, other types of dielectric materials, such as silicon nitride, can be substituted for silicon dioxide. Still further, it is preferred that conductor regions like 38 of FIG. 1 be incorporated into the structures of FIGS. 5 and 7. Still further, regions 56 and 56a of FIG. 7 can be eliminated. If so eliminated, it is preferred that a conductor region like region 38 of FIG. 1 be added or that an electrode and semiconductor region like electrode 380,000 and region 70 of FIG. 6 be added. This decreases the voltage handling capability of the resulting GDS structures; however, the spacing between cathode and adjacent gate regions can be increased to increase the usable voltage ranges. In addition, regions 56 and 56a can be replaced by guard rings such as the type illustrated around the cathode 24,000 of FIG. 5. Still further a region like region 220,000 and a guard ring like guard ring 400 of FIG. 6 can be substituted for regions 56, 56a of FIG. 7. Still further, the electrodes can be doped polysilicon, gold, titanium, or other types of conductors. Still further, the conductivity of all semiconductor substrates and regions can be reversed provided the voltage polarities are appropriately changed in the manner well known in the art. In such case, regions 18, 18a, 180, 180a, 1800, 1800a, 18,000, 18,000a, 54, 54a, 180,000, 180,000a, 18z and 18az become cathodes and regions 24, 24a, 240 240a, 2400, 2400a, 24,000, 24,000a, 58, 58a, 240,000, 240,000a, 24z and 24az become anodes. It is to be appreciated that the structures of the present invention allow alternating or direct current operation. A resistive type region like regions R1 and R1a of structure 10z of FIG. 8 can be used between: (1) anode region 1800(1800a) and cathode region 2400(2400a) of structure 1000 of FIG. 4, (2) anode region 18,000(18,000a) and region 40(40a) of structure 10,000 of FIG. 5, (3) anode region 180,000(180,000a) and region 220,000(220,000a) of structure 100,000 of FIG. 6, and (4) anode region 54(54a) and region 56(56a) of structure 42 of FIG. 7. The resistive type region R1(R1a) which would be added to structure 100,000 of FIG. 6 goes around regions 70 and 70a. The addition of an R1-like region to each of these structures and the choice of an appropriate impurity concentration for the corresponding semiconductor bodies allows these structures to be operated in a similar fashion to structure 10z of FIG. 8. Still further, a gate region having a conductivity type the same as that of the substrate 12, (120, 1200, 12,000, 120,000, 48, 48a, 12z and 12az) can be added to the structures of FIGS. 1, 3, 4, 5, 7 and 8 between the respective anode and cathode regions. Each of these added gate regions illustrated will have a separate electrode connected thereto which will typically be connected to the electrode connected to the substrate gate. Each of these added gate regions will also have a portion thereof which forms a part of the top major surface of the associated structure. Still further, regions 38, 38a, 380, 380a, 3800, 3800a, 38z, 38az, can be in direct contact with the major surface of each of the respective surfaces instead of being separated therefrom by the respective dielectric layers. When said regions are in direct contact with the major surface then it is desirable to extend the portions of the regions which are above the dielectric layers so as to "field plate" these regions in a similar fashion as is done for anode and cathode electrodes. Still further, the GDSs illustrated in FIGS. 3, 4, 5, 6, 7 and 8 can each be used as a type of bipolar transistor. Still further, a conductor(s) could be substituted for each of the semiconductor substrates 12, 120, 1200, 12,000, 120,000 and 12z and each of regions 20, 200, 2000, 20,000, 200,000 and 20z.

What is claimed is:

1. A structure comprising:
    a semiconductor body having a bulk region of one conductivity type contiguous with a top major surface of the body;
    a localized first region of the body which is of the one conductivity type;
    a localized second region of the body which is of the opposite conductivity type;
    the localized first and second regions are both of relatively low resistivity as compared with that of the bulk region and are both surrounded by portions of the bulk region;
    each of the first and second regions having a portion that forms part of the top major surface and having a separate electrode coupled thereto;
    a third region of the body which underlies the bulk region, the third region having a conductivity type which is opposite the first type and having a top surface which is at least partly common with a bottom surface of the bulk region, said third region having a separate electrode coupled thereto;
    the parameters of the structure being such that when the first region is forward biased with respect to the second region and the potential of the third region is insufficient to essentially completely deplete a cross-sectional portion of the bulk region then a substantial current flow is established between the first and second regions via the bulk region, and when the first region is forward biased with respect to the second region and the potential of the third region is sufficient to essentially completely deplete a cross-sectional portion of the bulk region and to cause the potential of this portion to be greater in magnitude than that of the first region then substantially interrupting (cut off) of said current flow between the first and second region is facilitated; and
    the third region being separated from the first and second regions by a portion of the bulk region.

2. The structure of claim 1 wherein the third region is a semiconductor region of the opposite conductivity from that of the bulk region of the semiconductor body.

3. The structure of claim 2 wherein:
    the semiconductor body includes a localized fourth region of the one conductivity type and of resistivity intermediate between that of the bulk of semiconductor body and the first region, the fourth region being free of any electrode contacting it; and
    the fourth region surrounds (wraps around) the second region so as to separate it from the bulk portion of the semiconductor body.

4. The structure of claim 3 wherein the fourth region is separated from the first region and the third region by portions of the bulk of the semiconductor body.

5. The structure of claim 3 further comprising:
    a semiconductor substrate of the opposite conductivity type of the third region;
    a plurality of said third regions are included in the semiconductor substrate
    the third regions being separated from each other by portions of the semiconductor substrate; and
    each third region surrounds (wraps around) a semiconductor body so as to separate it from the semiconductor substrate.

6. The structure of claim 5 wherein the semiconductor substrate is adapted to facilitate an electrode being coupled thereto.

7. The structure of claim 6 wherein the semiconductor substrate includes a plurality of fifth regions of the same conductivity type as the semiconductor substrate but of lower resistivity; and
    the fifth regions being located between adjacent third regions and being separated therefrom by portions of the semiconductor substrate.

8. The structure of claim 7 wherein the semiconductor body, the semiconductor substrate, the first, second, third, fourth and fifth regions are of p−, p, p+, n+, n+, p, and p+ type conductivity, respectively.

9. The structure of claim 7 wherein the semiconductor body, the semiconductor substrate, the first, second, third, fourth, and fifth regions are of n−, n, n+, p+, p+, n, and n+ type conductivity, respectively.

10. A pair of structures in accordance with claim 1 or claim 2 or claim 3 wherein two of the third regions are electrically common and the electrode coupled to the first region of each is connected to the electrode coupled to the second region of the other to provide a bilateral switch.

11. The structure of claim 1 or claim 2 or claim 3 wherein the electrodes coupled to the first and second regions are adapted to serve as output terminals and the electrode coupled to the third region is adapted to serve as a control terminal.

12. The structure of claim 1 or claim 2 or claim 3 wherein the structure is adapted to substantially inhibit or interrupt substantial current flow between the first and third regions if the first and second regions are coupled to essentially equal potential levels.

13. The structure of claim 1 further comprising:
a first resistive type semiconductor region included in the semiconductor body and being of the one conductivity type; and
the first resistive type semiconductor region connects to the first and second regions.

14. The structure of claim 3 further comprising:
a second resistive type semiconductor region included in the semiconductor body and being of the one conductivity type; and
the second resistive type semiconductor region connects the first and fourth regions.

15. The structure of claim 3 further comprising:
a localized sixth region which is of the opposite conductivity type and which has a portion thereof which is part of the major surface; and
the sixth region being located between the first and fourth regions and being separated from both and from a portion of the third region by portions of the bulk of the semiconductor body.

16. The structure of claim 15 further comprising a separate electrode in contact with the sixth region, said electrode being electrically coupled to the electrode which is coupled to the third region.

17. The structure of claim 1 or claim 2 or claim 3 further comprising:
a conductor region, said conductor region being located between the electrode coupled to the first region and the eletrode coupled to the second region; and
the conductor being electrically coupled to the electrode coupled to the third region.

18. The structure of claim 17 wherein the conductor region is separated from the semiconductor body by a dielectric layer.

19. The structure of claim 17 wherein the conductor region contacts the major surface of the semiconductor body and a portion of the conductor region which is above the dielectric layer extends further towards the electrodes coupled to the first and second regions than does the portion which contacts the major surface.

20. A solid-state switching device comprising:
a semiconductor body having a bulk portion which is of a first conductivity type;
a first region in the body having the first conductivity type;
a second region in the body having a second conductivity type opposite to that of the first conductivity type;
a third region in the body having the second conductivity type;
the first, second, and third regions having a lower resistivity than that of the bulk portion of the semiconductor body and being mutually separated by portions of the bulk portion;
the parameters of the device being such that, when the first region is forward biased with respect to the second region and the potential of the third region is insufficient to essentially completely deplete a cross-sectional portion of the bulk region, then a substantial current flow is esstablished between the first and second regions via the bulk region, and when the first region is forward biased with respect to the second region and the potential of the third region is sufficient to essentially completely deplete a cross-sectional portion of the bulk region and to cause the potential of this portion to be greater in magnitude than that of the first region and that of the second region, then substantial interrupting (cut off) of said current flow between the first and second regions is facilitated; and
the first and second regions each having a surface contained on a planar surface of the semiconductor body, and the third region being a semiconductor region that contacts the semiconductor body along a second surface of the semiconductor body opposed to the major surface.

21. The device of claim 20 wherein:
the semiconductor body includes a localized electrodeless fourth region of the first conductivity type and of a resistivity intermediate that of the bulk and that of the first region;
the fourth region surrounds the second region so as to separate it from the bulk portion of the semiconductor body; and
the fourth region being separated from the first and third regions by portions of the bulk of the semiconductor body.

22. The device of claim 20 further comprising:
a semiconductor substrate of the first conductivity type;
the semiconductor substrate surrounds the third region and is in contact with same.

23. The device of claim 20 wherein the third region is common to at least two switching devices with the first region of one device being connected to the second region of the other device and the second region of the first device being connected to the first region of the second device.

24. The device of claim 22 wherein a plurality of third regions are located in the semiconductor substrate, each third region surrounds (wraps around) a semiconductor body so as to separate it from the substrate, and the semiconductor substrate includes a plurality of regions of the first conductivity type but of lower resistivity than the semiconductor substrate, said regions being located between adjacent third regions and being separated therefrom by portions of the semiconductor substrate.

* * * * *